United States Patent
Hayashi

(10) Patent No.: US 7,195,974 B2
(45) Date of Patent: Mar. 27, 2007

(54) METHOD OF MANUFACTURING FERROELECTRIC FILM CAPACITOR

(75) Inventor: Takahisa Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/996,063

(22) Filed: Nov. 24, 2004

(65) Prior Publication Data

US 2005/0272170 A1    Dec. 8, 2005

(30) Foreign Application Priority Data

Jun. 7, 2004    (JP) .............................. 2004-168369

(51) Int. Cl.
*H01L 21/8242*    (2006.01)

(52) U.S. Cl. ............... 438/250; 438/240; 438/253; 438/393; 438/396; 438/686; 438/942

(58) Field of Classification Search ................ 438/210, 438/238, 239, 250, 393, FOR. 430, 3, 240, 438/253, 396, 686, 942, FOR. 220
See application file for complete search history.

(56) References Cited

U.S. PATENT DOCUMENTS

| | | | |
|---|---|---|---|
| 5,652,165 A | 7/1997 | Lu et al. | |
| 6,033,919 A * | 3/2000 | Gnade et al. | 438/3 |
| 6,399,433 B2 * | 6/2002 | Hofmann et al. | 438/240 |
| 6,403,416 B1 | 6/2002 | Huang et al. | |
| 6,483,691 B1 | 11/2002 | Nakamura | |
| 6,624,040 B1 * | 9/2003 | Ng et al. | 438/422 |
| 6,720,600 B2 | 4/2004 | Okita | |
| 6,727,535 B1 * | 4/2004 | Sengupta et al. | 257/295 |
| 6,858,492 B2 * | 2/2005 | Bruchhaus et al. | 438/253 |
| 2002/0155659 A1 * | 10/2002 | Chen et al. | 438/240 |
| 2003/0058700 A1 * | 3/2003 | Bruchhaus et al. | 365/200 |
| 2003/0129796 A1 * | 7/2003 | Bruchhaus et al. | 438/239 |
| 2003/0155598 A1 * | 8/2003 | Adkisson et al. | 257/295 |
| 2004/0173874 A1 * | 9/2004 | Saigoh | 257/535 |

FOREIGN PATENT DOCUMENTS

| | | |
|---|---|---|
| JP | 06-077430 | 3/1994 |
| JP | 2000-228494 | 8/2000 |
| JP | 2002-299555 | 10/2002 |

* cited by examiner

*Primary Examiner*—George R. Fourson
*Assistant Examiner*—Joannie Adelle García
(74) *Attorney, Agent, or Firm*—Volentine & Whitt, P.L.L.C.

(57) ABSTRACT

A method of manufacturing a ferroelectric film capacitor includes forming a platinum film used as an electrode material over a whole surface of a silicon substrate, batch-etching the platinum film to form opposite electrodes that serve as a pair of capacitor electrodes, and embedding a ferroelectric film corresponding to a dielectric film of the capacitor into a portion interposed between the pair of opposite electrodes.

19 Claims, 10 Drawing Sheets

METHOD OF MANUFACTURING FERROELECTRIC FILM CAPACITOR

BACKGROUND OF THE INVENTION

1. Field of the Invention

The present invention relates to a capacitor using a ferroelectric film employed in an FeRAM (Ferroelectric Random Access Memory), and particularly to a method of manufacturing a parallel plate capacitor.

2. Description of the Related Art

As has been shown in a prior art document, a capacitor of an FeRAM device generally has a horizontal-type parallel plate structure and comprises a lower electrode, a ferroelectric film and an upper electrode. A method of forming the upper electrode, the ferroelectric film and the lower electrode by batch-processing, using the same mask has been carried out extensively because of the merit of micro precision (see Japanese Unexamined Patent Publication No. 2003-243621).

Although a vertical-type parallel plate capacitor has also been known, the application thereof to a ferroelectric capacitor had not been carried out because its manufacturing method was difficult (see Japanese Unexamined Patent Publication No. Hei 6(1994)-77430 and No. 2002-299555).

The prior art will be explained below. A device isolation oxide film 2, a gate electrode 3 and a source-drain diffused layer 4 are formed in a silicon substrate 1. Thereafter, an interlayer insulating film 5 such as a silicon oxide film is deposited over the silicon substrate 1 and contact regions 6 are made open.

Then, a tungsten (W) film is deposited by a CVD method or the like and planarized to thereby form contacts 6 with tungsten embedded therein. Further, a first platinum (Pt) film 7 having a thickness of 150 nm, which serves as a lower electrode, an SBT ($SrBi_2Ta_2O_9$) film 8 having a thickness of 150 nm corresponding to a ferroelectric, and a second platinum film 9 having a thickness of 150 nm, which serves as an upper electrode, are sequentially formed (see FIG. 1).

A resist pattern 10 is formed by the normal photolithography technique, and the second platinum film 9 that serves as the upper electrode, the ferroelectric SBT film 8 and the first platinum film 7 that serves as the lower electrode are collectively etched (see FIG. 2). Although not shown in the drawing, a resist pattern 10 is removed in a manner similar to the prior art and an interlayer insulating film is formed over the entire surface. Thereafter, wirings for connecting a gate electrode 3, a source-drain diffused layer 4, a contact 6, etc. are formed to obtain a conventional ferroelectric capacitor.

In the prior art, a noble metal such as platinum, iridium (Ir) or the like is generally used for a lower electrode and an upper electrode. Since these metals are poor in chemical reactivity, their processing is generally based on an ion milling method corresponding to physical etching without depending on a chemical one.

Thus, a problem arose in that as shown in FIG. 3 corresponding to an enlarged view of a capacitor section, the side face of a ferroelectric capacitor was subjected to an etching gas and ions 11 upon batch etching of the ferroelectric capacitor, thereby sustaining plasma damage 12, so that a ferroelectric film 8 at a capacitor outer peripheral portion was deteriorated in quality and a sufficient function was not obtained as a memory. The batch etching could not be done in order to prevent the plasma damage 12 of the ferroelectric film 8 (see Japanese Unexamined Patent Publication Nos. 2000-228494 and 2000-228494).

A problem also arose in that when a contact section 14 was made open on an upper electrode 9 as shown in FIG. 4, a ferroelectric capacitor was subjected to an etching gas and ions, so that a charge-up electrical charge caused plasma damage to a ferroelectric film 8.

SUMMARY OF THE INVENTION

The present invention has been made in view of the foregoing problems. It is an object of the present invention to provide a ferroelectric film capacitor of a vertical structure formed by batch-etching electrodes alone and thereby enable an increase in and miniaturization of capacitance without etching damage of a ferroelectric film.

According to one aspect of the present invention, there is provided a method of manufacturing a ferroelectric film capacitor, comprising the steps of forming a metal film corresponding to an electrode material over the whole surface of a silicon substrate, patterning the metal film to form pairs of opposite electrodes that serve as capacitor electrodes, and embedding a ferroelectric film corresponding to a dielectric film of the capacitor into a portion interposed between the pair of opposite electrodes.

According to another aspect of the present invention, there is provided a method of manufacturing a ferroelectric film capacitor, comprising the steps of forming an insulating film over the whole surface of a silicon substrate, patterning the insulating film to form pairs of trenches, embedding a metal film corresponding to an electrode material into the pair of trenches to form a pair of opposite electrodes, removing the insulating film used to form the pair of opposite electrodes, and forming a ferroelectric film over the whole surface so as to embed the ferroelectric film into a region interposed between the pair of opposite electrodes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will be explained hereinafter in detail with reference to the accompanying drawings.

First Preferred Embodiment

Figure 5:
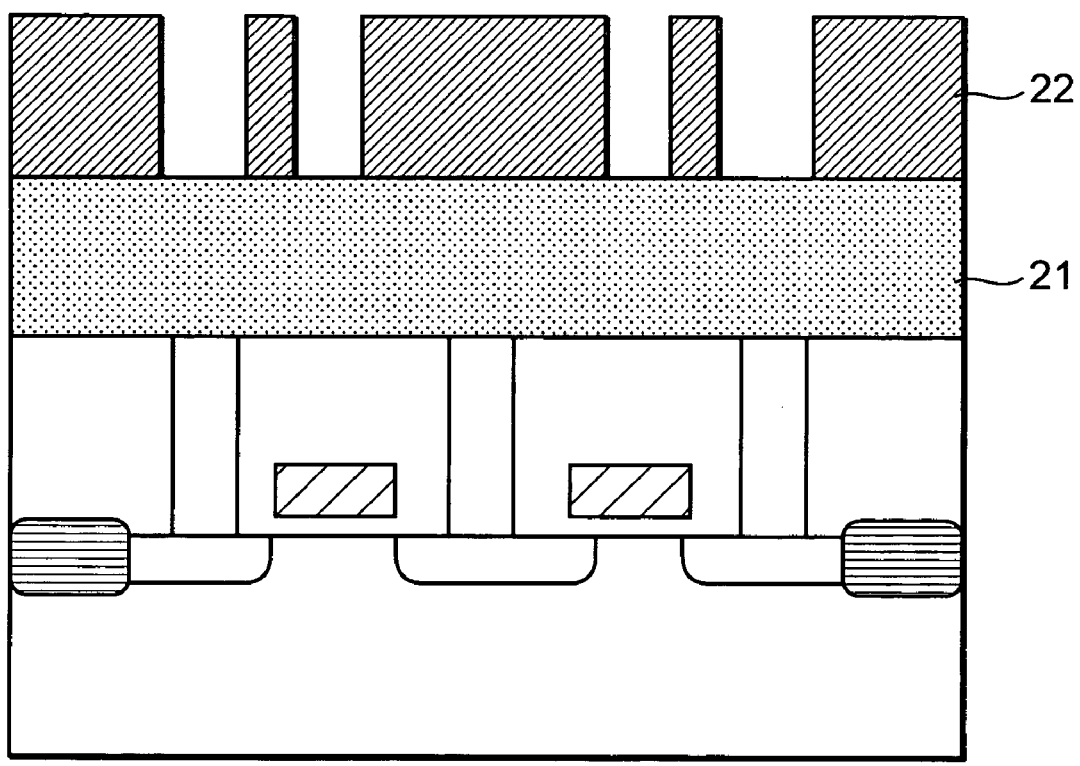
FIG. 5 is a process diagram showing a method of manufacturing a ferroelectric film capacitor, according to a first embodiment of the present invention.
Figure 6:
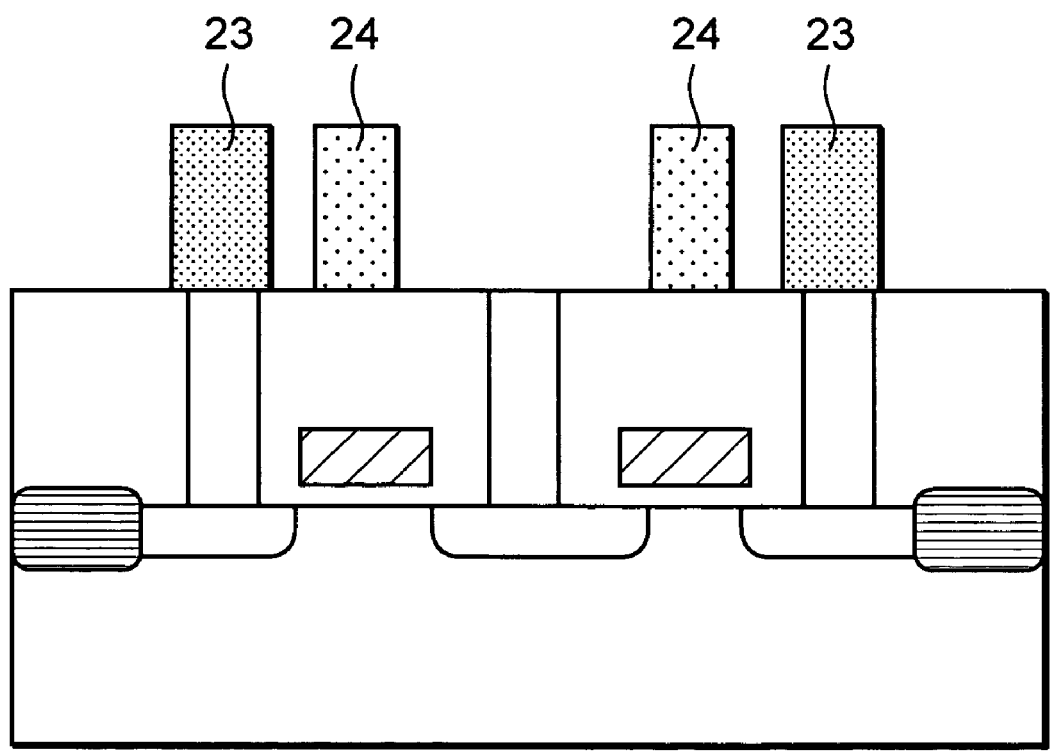
FIG. 6 is a process diagram following FIG. 5, illustrating the ferroelectric film capacitor manufacturing method according to the first embodiment of the present invention.
Figure 7:
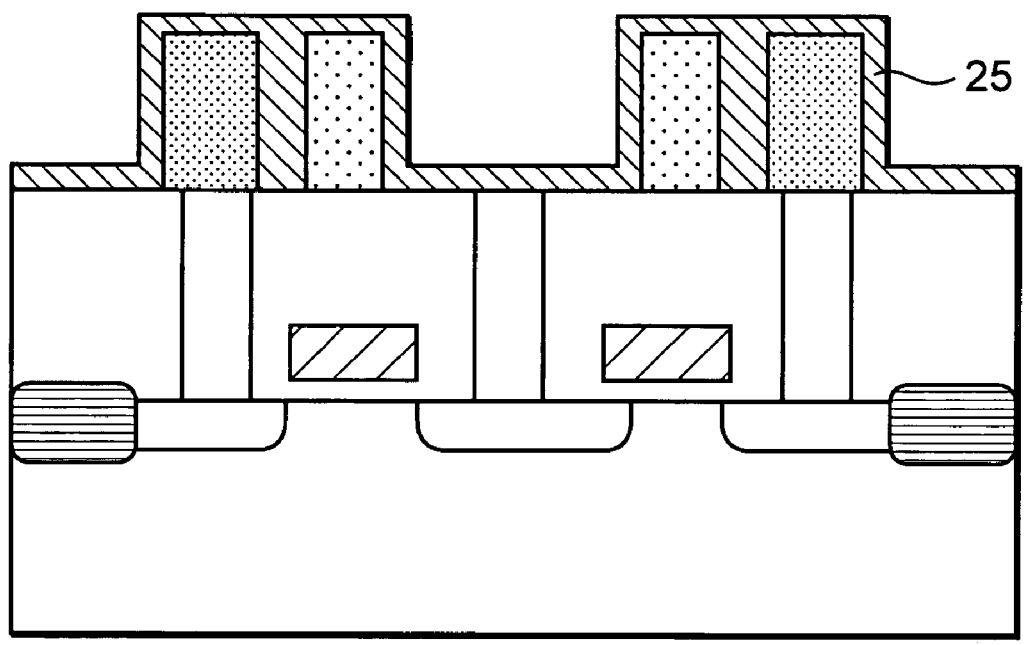
FIG. 7 is a process diagram following FIG. 6, depicting the ferroelectric film capacitor manufacturing method according to the first embodiment of the present invention.

A method of manufacturing a ferroelectric film capacitor, according to a first embodiment of the present invention will be explained with reference to FIGS. 5 through 7. Components up to contacts are formed in a manner similar to the prior art. Next, a platinum film 21 that serves as an electrode material is deposited 400 nm. Since one obtained by multiplying the thickness thereof by the length of an electrode in its depth direction results in an effective electrode area of a ferroelectric film capacitor, there is a need to deposit the platinum film 21 thick as compared with the conventional capacitor. Then, a resist pattern 22 is formed by the normal photolithography process (see FIG. 5).

Next, the platinum film 21 is processed into desired electrode patterns with the resist pattern 22 as a mask. Subsequently, the resist pattern 22 is removed and thereafter first and second electrodes 23 and 24, which serve as opposite electrodes of the capacitor, are formed (see FIG. 6). Since each of the electrodes connected to the lower contacts corresponds to the first electrode 23 in the present embodiment, the first electrode 23 is equivalent to a lower electrode in the capacitor structure of the prior art. Similarly, it can be said that the second electrodes 24 correspond to upper electrodes.

An SBT film 25 is deposited over the whole surface as a ferroelectric material by a MOCVD (Metal Organic Chemical Vapor Deposition) method or the like. In the present embodiment, there is a need to control forming conditions in such a manner that the ferroelectric SBT film 25 is sufficiently embedded between the first and second electrodes 23 and 24 (see FIG. 7).

Figure 8:
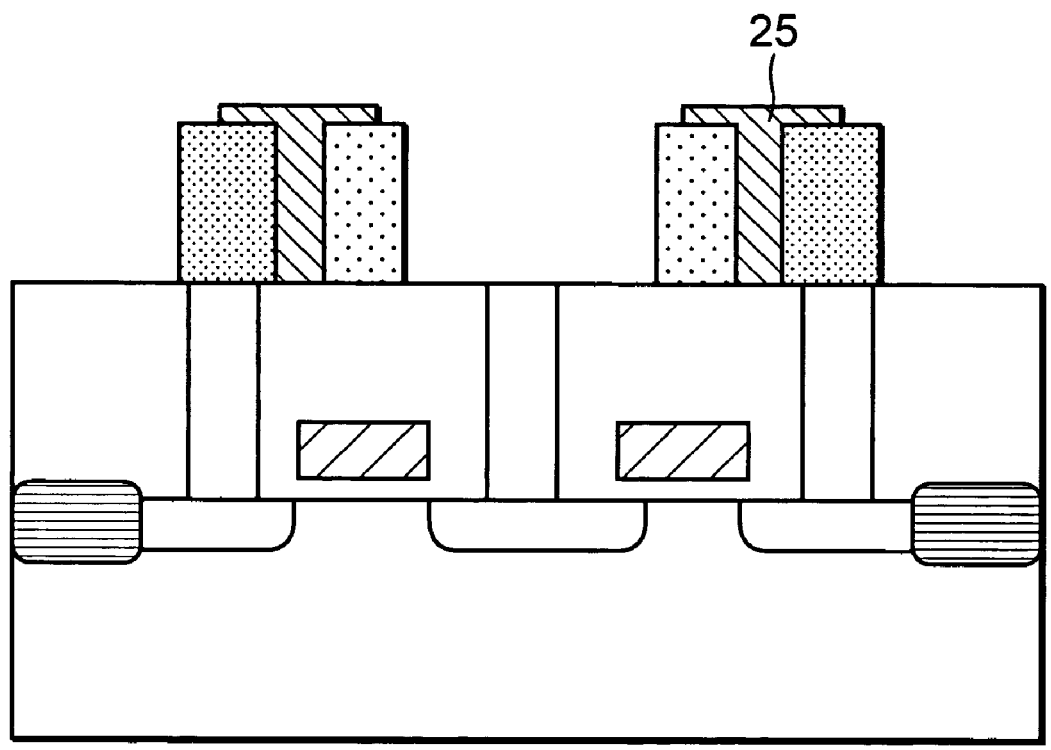
FIG. 8 is a process diagram showing a method of manufacturing a ferroelectric film capacitor, according to a second embodiment of the present invention.

Although the ferroelectric SBT film 25 is formed even at portions other than between the first and second electrodes 23 and 24, each of which acts as a capacitor ferroelectric film, no problem occurs even if the ferroelectric film is caused to remain because it also serves as an insulating film. If it is necessary to prevent a problem such as unintentional charge storage, then, the ferroelectric film 25 other than a capacitor section may be removed as shown in FIG. 8 by way of example.

In the ferroelectric film capacitor structure according to the present invention, although the manufacturing method according to the first embodiment of the present invention has been shown above, the ferroelectric film is formed at the portion interposed between the vertically formed first and second electrodes 23 and 24, i.e., a pair of opposite electrodes, and the portion that acts as the ferroelectric film of the capacitor film is not subjected to etching. Therefore, a ferroelectric film capacitor can be formed without plasma damage at the processing of the ferroelectric film.

Figure 1:
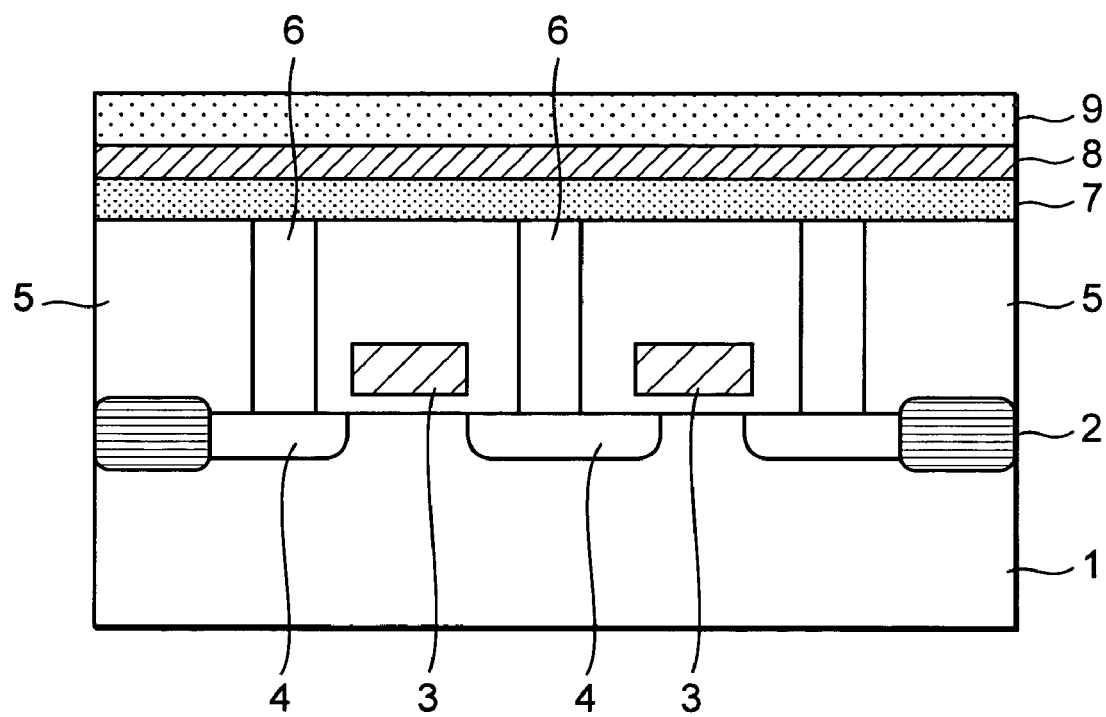
FIG. 1 is a process diagram showing a method of manufacturing a ferroelectric capacitor, according to a prior art.
Figure 2:
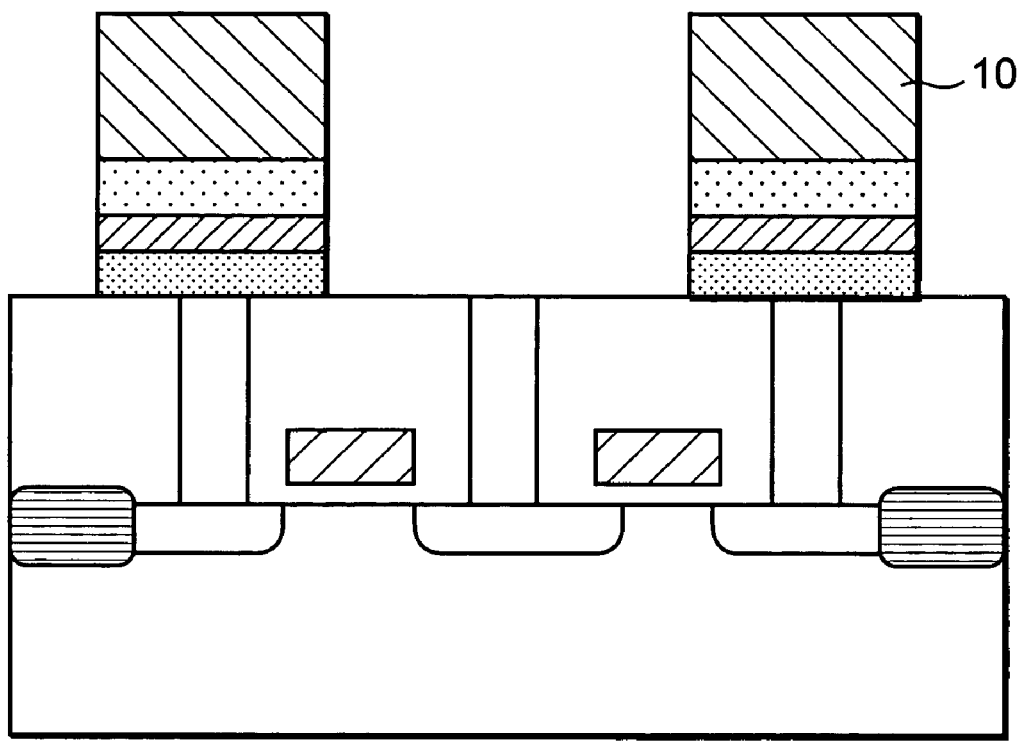
FIG. 2 is a process diagram following FIG. 1, showing the ferroelectric capacitor manufacturing method according to the prior art.
Figure 3:
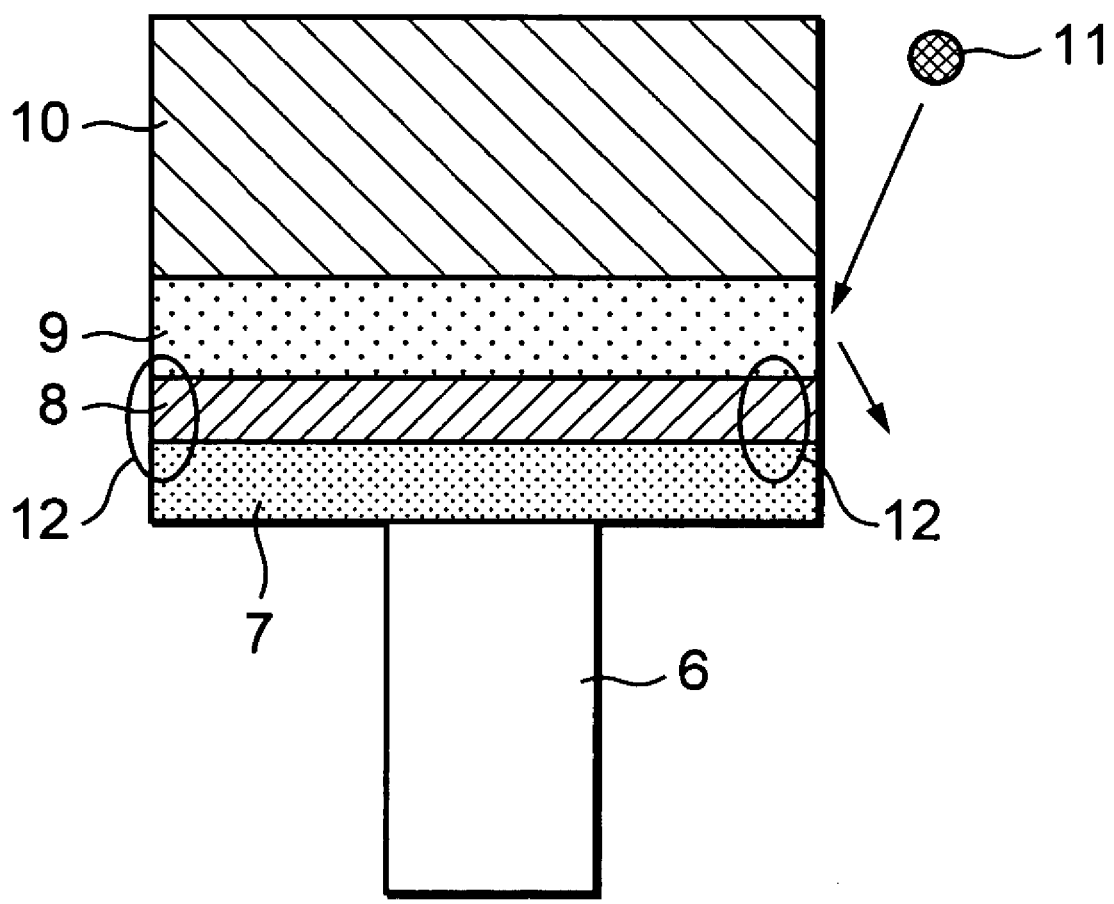
FIG. 3 is an explanatory diagram showing a problem in the ferroelectric capacitor manufacturing method according to the prior art.
Figure 4:
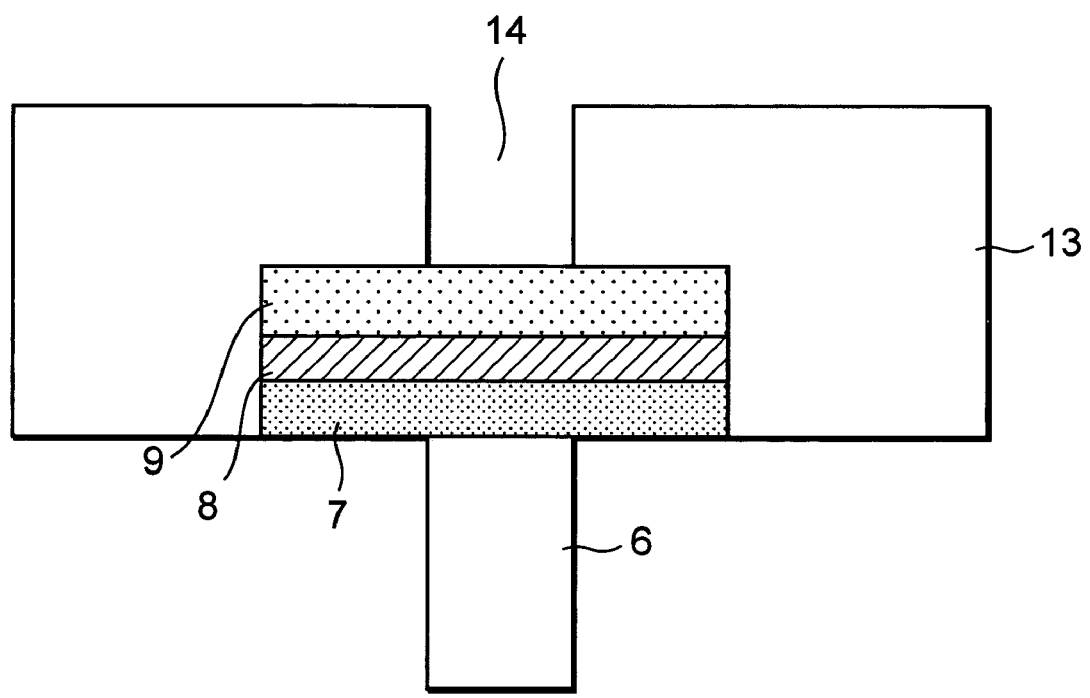
FIG. 4 is an explanatory diagram illustrating a problem in the ferroelectric capacitor manufacturing method according to the prior art.

Since it is not necessary to form the contact section immediately above the capacitor acting portion, the plasma damage (see FIG. 4) at the contact formation can be prevented. Further, since the capacitor electrodes are formed in the vertical direction, a fine or micro capacitor can be formed without taking up a large area as compared with the conventional capacitor.

Second Preferred Embodiment

Figure 9:
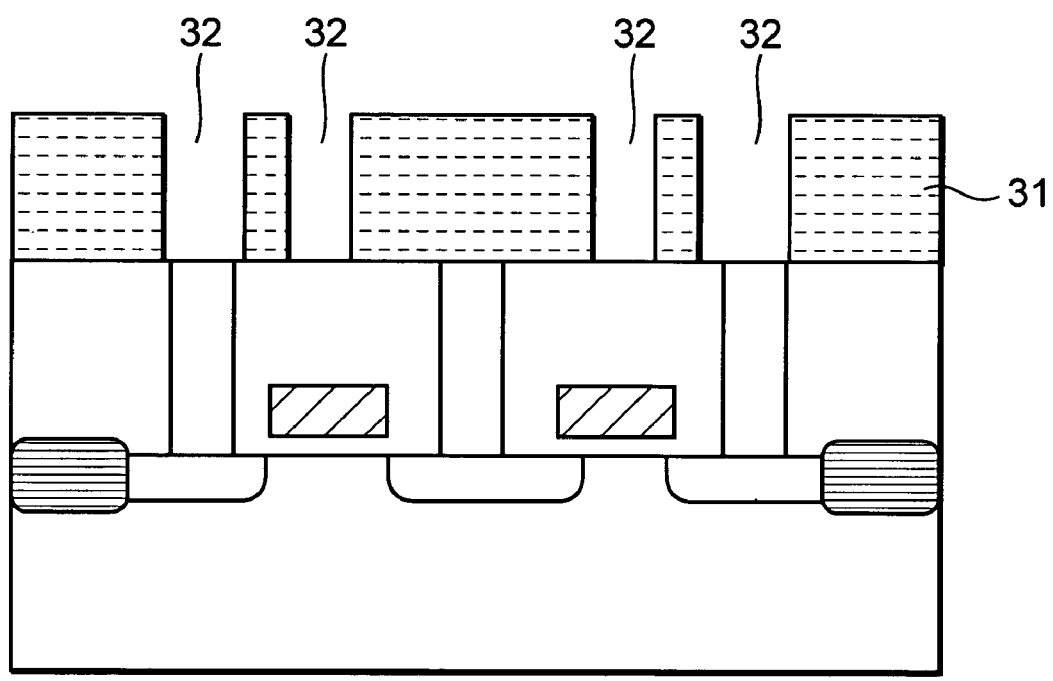
FIG. 9 is a process diagram following FIG. 8, illustrating the ferroelectric film capacitor manufacturing method according to the second embodiment of the present invention.
Figure 10:
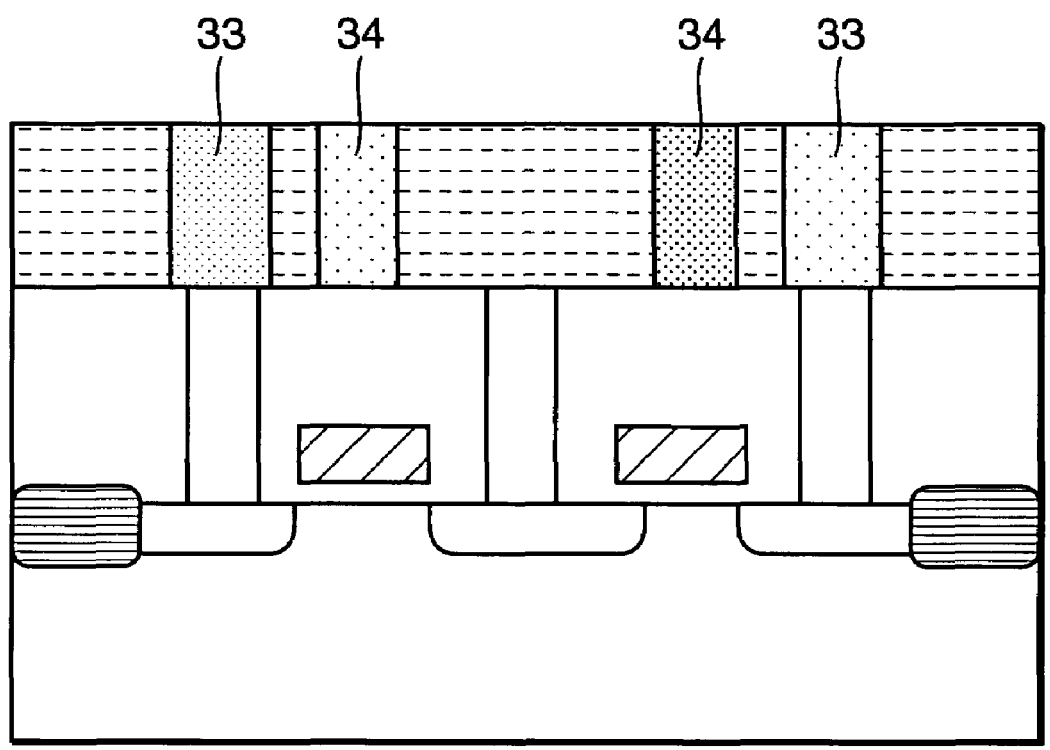
FIG. 10 is a process diagram following FIG. 9, showing the ferroelectric film capacitor manufacturing method according to the second embodiment of the present invention.

A method of manufacturing a ferroelectric film capacitor, according to a second embodiment of the present invention will be explained with reference to FIGS. 9 and 10. Components up to contacts are formed in a manner similar to the prior art. Further, an electrode forming insulating film 31 such as a silicon oxide film is deposited 400 nm by, for example, a CVD method and etched using a resist mask or the like by a photolithography method to form trenches 32 (see FIG. 9).

Next, the resist film or the like is removed and thereafter a platinum film used as an electrode material is formed by a sputtering method or the like and perfectly embedded into the trenches 32. The whole portion is planarized by a CMP method to remove the platinum film 33 deposited immediately above the electrode forming insulating film 31 (see FIG. 10), so that first and second electrodes 33 and 34 of platinum are formed.

Further, the electrode forming insulating film 31 is selectively removed to cause the first and second electrodes 33 and 34 to remain. If a ferroelectric film is formed over the entire surface, then first and second electrodes 33 and 34 for the capacitor which are exactly similar in structure to the first embodiment of the present invention, and a structure in which a ferroelectric film is located between the electrodes, can be formed (see FIG. 6).

Since the opposite electrodes of the capacitor are formed by a planarization method in the second embodiment of the present invention, each electrode can be formed thick. If both electrodes corresponding to the opposite electrodes are formed in discrete processes, then the opposite electrodes can also be formed of materials different from each other. A ferroelectric film free of etching damage is formed in a manner similar to the first embodiment.

In the manufacturing method of the present invention as described above, a vertical capacitor structure is formed. Therefore, a micro FeRAM capacitor cell structure can be formed. Further, since a ferroelectric film is formed after the formation of opposite electrodes, it can be fabricated with no etching damage. As a result, a high reliable FeRAM capacitor can be formed.

In the method of manufacturing a ferroelectric film capacitor, according to the present invention, a vertical type parallel plate type can be formed by batch processing. Therefore, a ferroelectric capacitor can be formed which can increase the capacitance per area and is brought into high integration. Further, since a ferroelectric film can be formed after an upper electrode and a lower electrode have been patterned, a ferroelectric film less reduced in etching damage can be formed.

While the preferred forms of the present invention have been described, it is to be understood that modifications will be apparent to those skilled in the art without departing from the spirit of the invention. The scope of the invention is to be determined solely by the following claims.

What is claimed is:

1. A method of manufacturing a ferroelectric film capacitor, comprising:

forming a metal film over a whole surface of a silicon substrate;

patterning the metal film using a mask pattern to form a pair of first and second electrodes that oppose each other; and embedding a ferroelectric film into a region between the pair of first and second electrodes so that the ferroelectric film fills all of the region between the first and second electrodes, to form a ferroelectric film between the first and second electrodes.

2. The method according to claim 1, wherein the ferroelectric film covers an entirety of the pair of first and second electrodes.

3. The method according to claim 2, wherein the metal film is a noble metal.

4. The method according to claim 3, wherein the noble metal is platinum or iridium.

5. The method according to claim 1, wherein said embedding a ferroelectric film comprises:

covering the silicon substrate and an entirety of the pair of first and second electrodes with a ferroelectric material; and removing the ferroelectric material from the silicon substrate, so that the ferroelectric material remains as the ferroelectric film only on and embedded between the pair of first and second electrodes.

6. The method according to claim 5, wherein said removing the ferroelectric material comprises removing the ferroelectric material from side surfaces and portions of uppermost surfaces of the pair of first and second electrodes.

7. The method according to claim 1, wherein said embedding a ferroelectric film comprises metal organic chemical vapor deposition of $SrBi_2Ta_2O_9$.

8. The method according to claim 1, wherein the ferroelectric film capacitor is a vertical-type ferroelectric film capacitor.

9. The method according to claim 1, wherein the pair of first and second electrodes are vertical electrodes.

10. A method of manufacturing a ferroelectric film capacitor, comprising:

forming a metal film over a whole surface of a silicon substrate;

patterning the metal film to form a pair of first and second electrodes that oppose each other;

forming a ferroelectric film over the whole surface of the silicon substrate to embed the ferroelectric film into a region between the pair of first and second electrodes, so that the ferroelectric film fills all of the region between the first and second electrodes and a ferroelectric film is formed between the first and second electrodes; and etching the ferroelectric film so that the ferroelectric film remains as covering at least parts of upper surfaces of the pair of first and second electrodes.

11. The method according to claim 10, wherein the metal film is a noble metal.

12. The method according to claim 11, wherein the noble metal is platinum or iridium.

13. The method according to claim 10, wherein said patterning the metal film comprises using a mask pattern.

14. The method according to claim 10, wherein said forming a ferroelectric film comprises metal organic chemical vapor deposition of $SrBi_2Ta_2O_9$.

15. The method according to claim 10, wherein the ferroelectric film capacitor is a vertical-type ferroelectric film capacitor.

16. The method according to claim 10, wherein the pair of first and second electrodes are vertical electrodes.

17. A method of manufacturing a ferroelectric film capacitor comprising:

providing a substrate including a device formed on a first surface thereof;

forming an insulating layer over the first surface of the substrate;

forming a conductive via through the insulating layer to be in contact with the device;

forming a metal film over the insulating layer;

patterning the metal film using a mask to form first and second electrodes on the insulating layer that oppose each other, wherein one of the first and second electrodes contacts with the conductive via; and embedding a ferroelectric film between the first and second electrodes to form a ferroelectric film between the first and second electrodes.

18. The method of manufacturing a ferroelectric film capacitor of claim 17, wherein the ferroelectric film covers an entirety of the first and second electrodes.

19. The method of manufacturing a ferroelectric film capacitor of claim 17, wherein the ferroelectric film covers parts of upper surfaces of the first and second electrodes, and other parts of the upper surfaces of the first and second electrodes are not covered by the ferroelectric film.

* * * * *